United States Patent
Sandhu et al.

(10) Patent No.: US 8,274,110 B2
(45) Date of Patent: Sep. 25, 2012

(54) VERTICALLY-ORIENTED SEMICONDUCTOR SELECTION DEVICE PROVIDING HIGH DRIVE CURRENT IN CROSS-POINT ARRAY MEMORY

(75) Inventors: Gurtej Sandhu, Boise, ID (US); John K. Zahurak, Boise, ID (US); Jay Parks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 570 days.

(21) Appl. No.: 12/469,563

(22) Filed: May 20, 2009

(65) Prior Publication Data

US 2010/0295120 A1    Nov. 25, 2010

(51) Int. Cl.
*H01L 29/66*    (2006.01)

(52) U.S. Cl. .................. 257/329; 257/E29.262

(58) Field of Classification Search .............. 257/213, 257/288, 327–346, E29.001, E29.166, E29.169, 257/E29.226, E29.242, E29.255, E29.262
See application file for complete search history.

(56) References Cited

U.S. PATENT DOCUMENTS

| | | | |
|---|---|---|---|
| 5,107,321 A | 4/1992 | Ilderem et al. | |
| 5,824,577 A | 10/1998 | Luich | |
| 5,899,735 A | 5/1999 | Tseng | |
| 5,918,141 A * | 6/1999 | Merrill | 438/583 |
| 6,165,826 A | 12/2000 | Chau et al. | |
| 6,218,276 B1 | 4/2001 | Liu et al. | |
| 6,300,198 B1 | 10/2001 | Aeugle et al. | |
| 6,677,204 B2 * | 1/2004 | Cleeves et al. | 438/268 |
| 6,940,113 B2 | 9/2005 | Hsu et al. | |
| 8,076,717 B2 * | 12/2011 | Sandhu et al. | 257/329 |
| 2004/0157353 A1 * | 8/2004 | Ouyang et al. | 438/38 |
| 2006/0017088 A1 | 1/2006 | Abbott et al. | |
| 2008/0035958 A1 * | 2/2008 | Asao | 257/204 |
| 2008/0049486 A1 | 2/2008 | Gruening-von Schwerin | |
| 2008/0099814 A1 | 5/2008 | Gruening-von Schwerin et al. | |
| 2009/0166703 A1 * | 7/2009 | Lin et al. | 257/303 |
| 2010/0295119 A1 * | 11/2010 | Sandhu et al. | 257/329 |

FOREIGN PATENT DOCUMENTS

WO    WO 2005/079182    9/2005

* cited by examiner

*Primary Examiner* — Ha Tran T Nguyen
*Assistant Examiner* — Kevin Quinto
(74) *Attorney, Agent, or Firm* — Dickstein Shapiro LLP (57) ABSTRACT

A vertical semiconductor material mesa upstanding from a semiconductor base that forms a conductive channel between first and second doped regions. The first doped region is electrically coupled to one or more first silicide layers on the surface of the base. The second doped region is electrically coupled to one of a plurality of second silicide layers on the upper surface of the mesa. A gate conductor is provided on one or more sidewalls of the mesa.

26 Claims, 7 Drawing Sheets

VERTICALLY-ORIENTED SEMICONDUCTOR SELECTION DEVICE PROVIDING HIGH DRIVE CURRENT IN CROSS-POINT ARRAY MEMORY

CROSS-REFERENCE TO RELATED APPLICATIONS

This application is related to U.S. patent application Ser. No. 12/469,433, filed concurrently herewith, the specification of which is herein incorporated by reference in its entirety.

FIELD OF THE INVENTION

The embodiments disclosed herein relate generally to the field of semiconductor selection devices and, more particularly, to access devices for semiconductor memory devices.

BACKGROUND OF THE INVENTION

A non-volatile memory device is capable of retaining stored information even when power to the memory device is turned off. Traditionally, non-volatile memory devices occupied large amounts of space and consumed large quantities of power. As a result, non-volatile memory devices have been widely used in systems where limited power drain is tolerable and battery-life is not an issue. However, as systems requiring non-volatile memories have continued to shrink in size, improvements in non-volatile memory devices have been sought in order to make these devices more suitable for use in portable electronics or as substitutes for frequently-accessed volatile memory devices. Desired improvements include decreasing the size and power consumption of these memories and improving the memory access devices.

Improved non-volatile memory devices under research include resistive memory cells where resistance states can be programmably changed. Resistive memory cells store data by structurally or chemically changing a physical property of the memory cells in response to applied programming voltages, which in turn changes cell resistance. Examples of variable resistance memory devices being investigated include memories using variable resistance polymers, perovskite materials, doped amorphous silicon, phase-changing glasses, and doped chalcogenide glass, among others. Phase change memory ("PCM") cells have varying resistances as a result of changes in the phase of the cell material. Spin-tunneling random access memory ("STRAM") cells have varying resistances as a result of changes in current induced magnetization of the cell material.

For many resistive memory cells, changing the cell resistance is accomplished by passing an electrical current of sufficient strength through the resistive memory cell. For phase change memory cells and spin-tunneling memory cells, for example, programming and reset currents of 50 to 100 µA are not uncommon. However, these high currents result in extremely high current densities as the size of the memory cells continues to shrink. For example, for a 20×20 nm$^2$ memory cell, the resulting current density is of the order of $1 \times 10^7$ A/cm$^2$ or greater. For such high current densities, improved memory access devices are desired to provide high currents and low "off" state leakage.

Improved access devices such as those desired for use with resistive memory cells could also be used to provide high currents to any type of memory or semiconductor circuit that requires a high current.

DETAILED DESCRIPTION OF THE INVENTION

Traditional memory access devices are planar in nature, meaning that the access devices are formed layer by layer within the plane of the underlying structure. The underlying structure includes a substrate that is a base material and layers formed on the surface of the substrate. The substrate and overlaying layers on top of the substrate are flat or planar. The access devices are formed within these layers so that the resulting devices are also laid out in a planar arrangement. As a specific example, a planar field-effect transistor ("FET") is a FET with a conductive channel that is within the layers of the underlying structure. Planar access devices have a relatively large footprint and suffer from leakage currents or must be isolated from each other in order to avoid leakage currents.

Non-planar access devices are alternatives to planar devices. Non-planar access devices are access devices that are not flat or planar and can be oriented in a vertical direction from a substrate. These devices include raised portions that extend above the planar surface of the underlying structure. An example of a non-planar access device is a fin-FET. A fin-FET is a FET that includes thin vertical "fins" of the underlying substrate material that act as the transistor body. The source and drain of the fin-FET are located at the ends of the fin, while one or more gates are located on a surface of the fin. Upon activation, current flows through the fin. The thin vertical structure results in significant space savings over traditional planar access devices.

Figure 1:
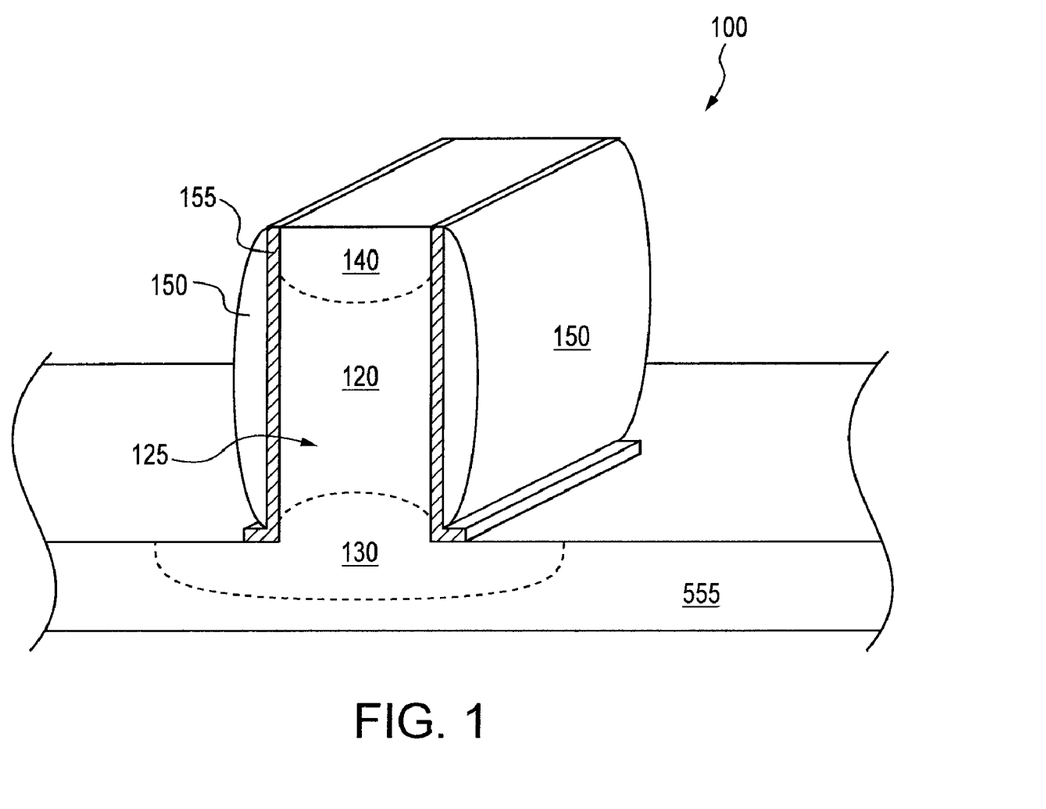
FIG. 1 illustrates a vertically-oriented semiconductor transistor device.

FIG. 1 illustrates a vertical FET 100. The vertical FET 100 includes a thin vertical fin or mesa 120 through which current flows vertically between a source 130 and a drain 140. The mesa 120 extends above a substrate 555. In the example vertical FET 100, the substrate 555 and the mesa 120 are formed of silicon. The source 130 and drain 140 regions are both either n-doped or p-doped, while a vertical current channel 125 is either p-doped or n-doped, accordingly. A gate 150 is formed along a sidewall of the mesa 120. Additional gates 150 may be formed. In the example of FIG. 1, two gates 150 are formed on opposite sidewalls of the mesa 120, although vertical FET 100 may also be formed with only a single gate 150. Gates 150 are separated from the sidewalls of the mesa 120 by thin gate insulators 155 such as a gate oxide layer. The thin gate insulators 155 are L-shaped in order to insulate the gates 150 from contact with the mesas 120 and the substrate 555 or any conductor on the substrate 555. The gates 150 may be formed of polysilicon, metal, or silicides, for example. When an appropriate bias is applied to one or more of the gates 150, current flows vertically through the channel 125 from the source 130 to the drain 140.

Figure 2A:
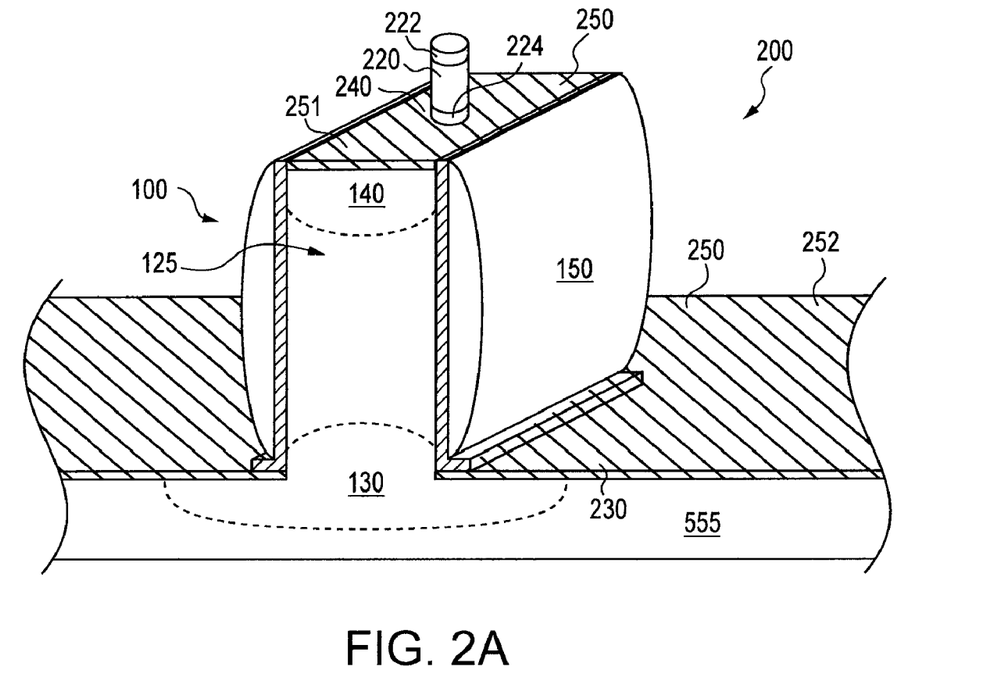
FIGS. 2A and 2B illustrate a memory cell and a memory access device, according to one or more embodiments of the disclosure.
Figure 2B:
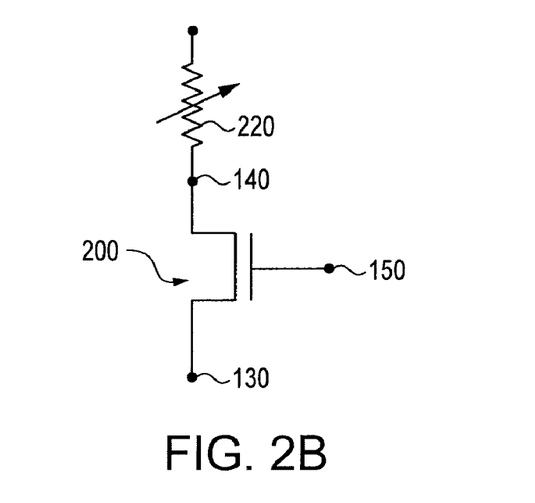

In a disclosed embodiment, the vertical FET 100 may be used as a selection device such as a memory access device 200 for one or more electrical devices, as illustrated in the structure of FIG. 2A and the schematic diagram of FIG. 2B. In FIG. 2A, a memory cell 220 is electrically coupled to the vertical FET device 200. The memory cell 220 includes a top electrode 222 and a bottom electrode 224. The bottom electrode 224 is coupled to a contact 240 for the drain 140. The source 130 is coupled to a contact 230. Upon appropriate biasing of the source contact 230, the gate 150 and the top electrode 222, the vertical FET 100 is turned "on" and current flows through the channel 125 and memory cell 220. With appropriate biasing, the current flowing through the memory cell 220 is strong enough to be used as a programming or reset current for the memory cell 220.

The memory access device 200 and the memory cells 220 are generally formed in an array of access devices 200 and memory cells 220. Thus, the source contact 230 may extend a relatively long distance from the source 130 of memory access device 200 to the nearest voltage source. Additionally, source contacts 230 may be shared by multiple access devices. In order to facilitate the shared contacts 230 and to minimize the effect of parasitic resistance, the contacts 230 are formed of metal silicide 250. In other words, the substrate 555 surface near the bottom of the mesa 120 is solicited with metal such as Ni, Co or Ti. The metal silicide 250 (also known as a salicide) near the bottom of the mesa 120 (or the source metal silicide layer 252) acts to reduce the series resistance that results from using a common current source contact for each individual access device 200 in an array. The source contacts 230 may also be formed of heavily doped silicon as long as the resistance of the doped silicon is low enough to carry the required current.

Additionally, the drain contact 240 is also formed of a metal silicide 250 which helps to reduce contact resistance between the access device 200 and the bottom electrode 224 of the memory cell 220. The metal silicide 250 formed on the upper portion of the access device 200 is the drain metal silicide layer 251.

Figure 3A:
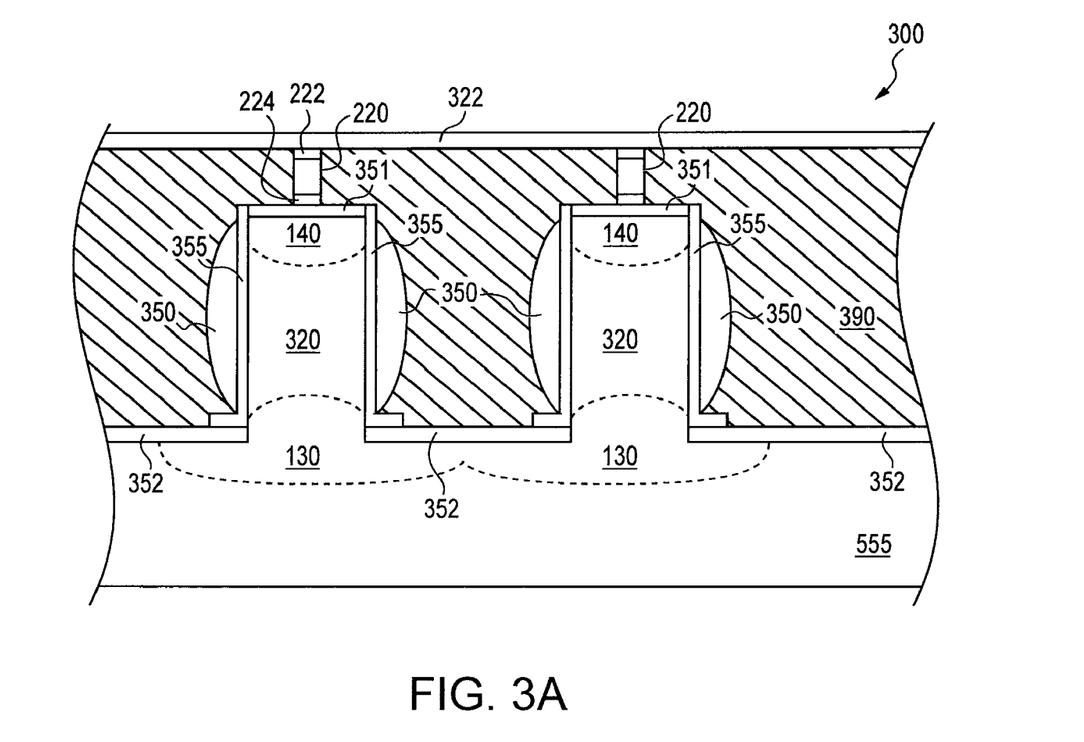
FIGS. 3A, 3B and 3C illustrate an array of memory cells and memory access devices, according to one or more embodiments of the disclosure.
Figure 3B:
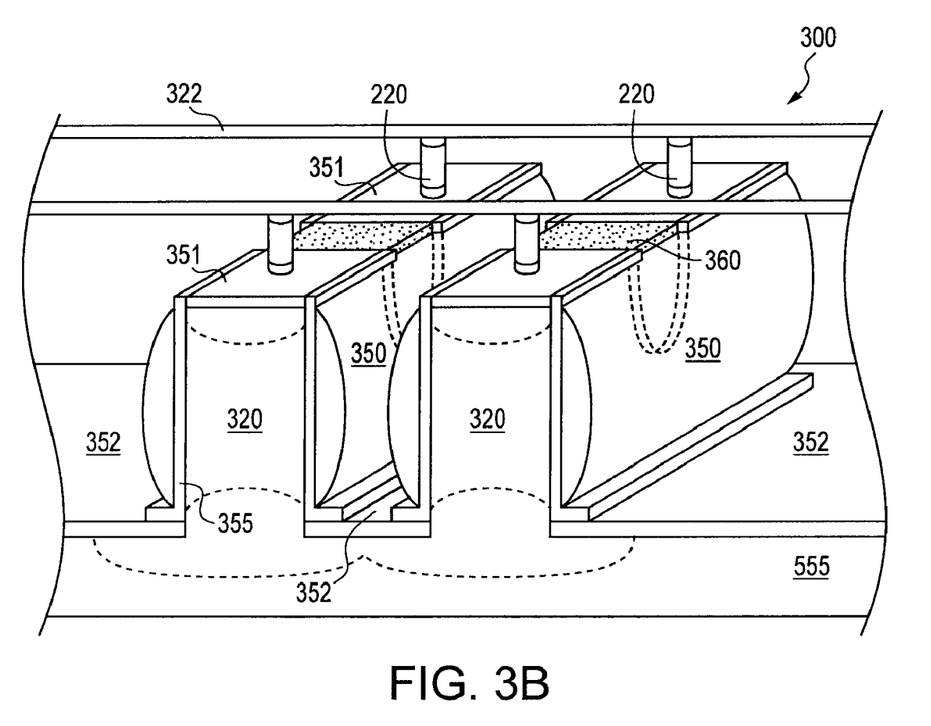

In a disclosed embodiment, the access devices 200 and the memory cells 220 are arranged in an array 300 as illustrated in FIGS. 3A and 3B. In FIGS. 3A and 3B, a silicon substrate 555 is shown. Rising from the silicon substrate 555 are one or more silicon mesas 320. Each mesa 320 linearly extends in a single direction across the substrate 555. Multiple mesas 320 are spaced apart from each other and are parallel to each other. In FIGS. 3A and 3B, only two mesas 320 are illustrated for purposes of simplicity. However, many more mesas 320 may be included in array 300. Other substrate and mesa material, such as Ge, SiC, GaN, GaAs, InP, graphene and carbon nanotubes, for example, may be used instead of silicon.

The mesas 320 each include source 130, drain 140 and gate 350 regions. The gate 350 regions are formed on one or more sidewalls of the linearly extended mesas 320. In the example of FIGS. 3A and 3B, gates 350 are formed on two opposite sides of each mesa 320, thus forming double-gated vertical FETs. Single-gated vertical FETs (i.e., only one gate 350 on a mesa 320) or surround-gated vertical FETs (i.e., mesa 320 is surrounded by a gate 350) may also be formed. The sidewall gates 350 extend along the column of mesas 320 so that each column of mesas 320 includes one or two common sidewall gates 350. The sidewall gates 350 may also be solicited. The source 130 regions of each mesa 320 are commonly shared by each mesa 320 and are electrically coupled with the source metal silicide layer 352 which, as shown in FIG. 3B, covers the surface of the silicon substrate 555 near the mesas 320. In this way, source 130 regions for multiple mesas 120 are electrically coupled together to form shared sources 130. Source 130 regions may also merge into a single common source 130. It is also possible to use a source metal silicide layer 352 that does not cover the entire surface of the silicon substrate 555 near the mesas 320 as long as the source metal silicide layer 352 is still in contact with the sources 130. For example, narrow strips of source metal silicide layer 352 could be formed only near the bases of the mesas 320. The drain 140 regions are electrically coupled to the drain metal silicide layer 351 which covers the upper level of the mesas 320. The gates 350 are insulated from the silicide layers 351, 352 by the thin gate insulator 355.

The memory cells 220 are electrically coupled via a bottom electrode 224 to the drain metal silicide layer 351 located on the upper surfaces of the mesas 320. The top electrode 222 of each memory cell 220 is electrically coupled to a conductor 322 and which may, for example, be formed of metal, and which extends horizontally in a direction perpendicular to the direction that the sidewall gates 350 extend. A known interlayer dielectric ("ILD") material 390, for example, silicon oxide, is used to fill-in the gaps between the mesas 320, substrate 555 and the metal contacts 322.

The upper level of each mesa 320 is periodically interrupted by a recess 360 located in between adjacent memory cells 220. The recess 360 extends through the drain metal silicide layer 351 and into the mesa 320. The recess 360 interrupts the electrically conductive drain metal silicide layer 351 so as to isolate the individual coupling of memory cells 220 to the mesas 320, thus reducing the occurrence of sneak paths for charge leakage in the array 300. The recess 360 is filled with an oxide material such as a spin-on dielectric ("SOD") silicon oxide or a high density plasma ("HDP") silicon oxide or some other non-conductive material. In FIG. 3B, gate oxide 355 does not extend from the recess 360. Instead, in FIG. 3B, gate 350 directly bounds recess 360. Other configurations may be used, however. For example, gate oxide 355 could extend across recess 360 and directly bound recess 360.

Figure 3C:
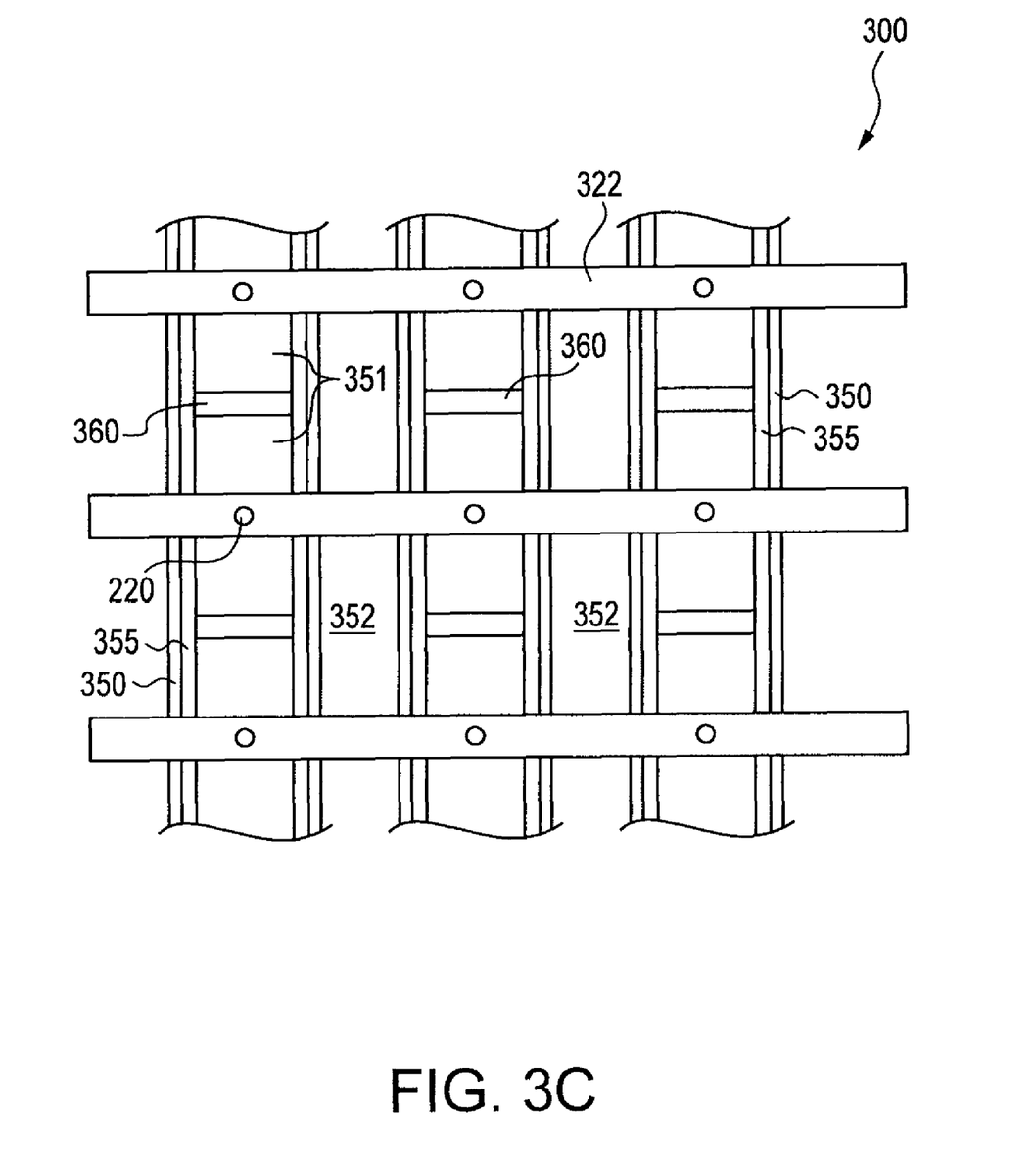

A simplified top view of the array 300 is illustrated in FIG. 3C. The ILD material 390 is not shown in the top view. In the top view, it is apparent that each mesa 320, and hence each memory cell 220 coupled to a single mesa 320, share a common source metal silicide layer 352 that extends along the base of each mesa 320. Additionally, each memory cell 220 coupled to a same mesa 320 shares a common gate 350 that also extends along the length of the sidewall of each mesa 320. The upper level of each mesa 320 is covered by the drain metal silicide layer 351, which is periodically interrupted by the recesses 360.

Individual memory cells 220 are activated (meaning that a desired current flows through the memory cell 220) by the appropriate biasing of the source 130 via the respective strip of source metal silicide layer 352, the respective gate 350 and the respective conductor 322. While biasing a strip of source metal silicide layer (352 or any one of the gates 350 or conductors 322) may affect multiple memory cells 220, activation of a specific memory cell 220 is only accomplished through the appropriate biasing of that cell's connected source metal silicide layer 352, gate 350 and conductor 322.

By using a common source 130 for every memory cell 220 on a mesa 320 (via the use of source metal silicide layer 352), the occurrence of parasitic resistances is reduced. The source metal silicide layer 352 reduces the series resistance that arises from common current source contact to each individual device in the array 300. Additionally, by using a drain metal silicide layer 351 on the top surface of each mesa 320, the contact resistance between the access device 200 and the bottom electrode 224 of each memory cell 220 is reduced.

Figure 4:
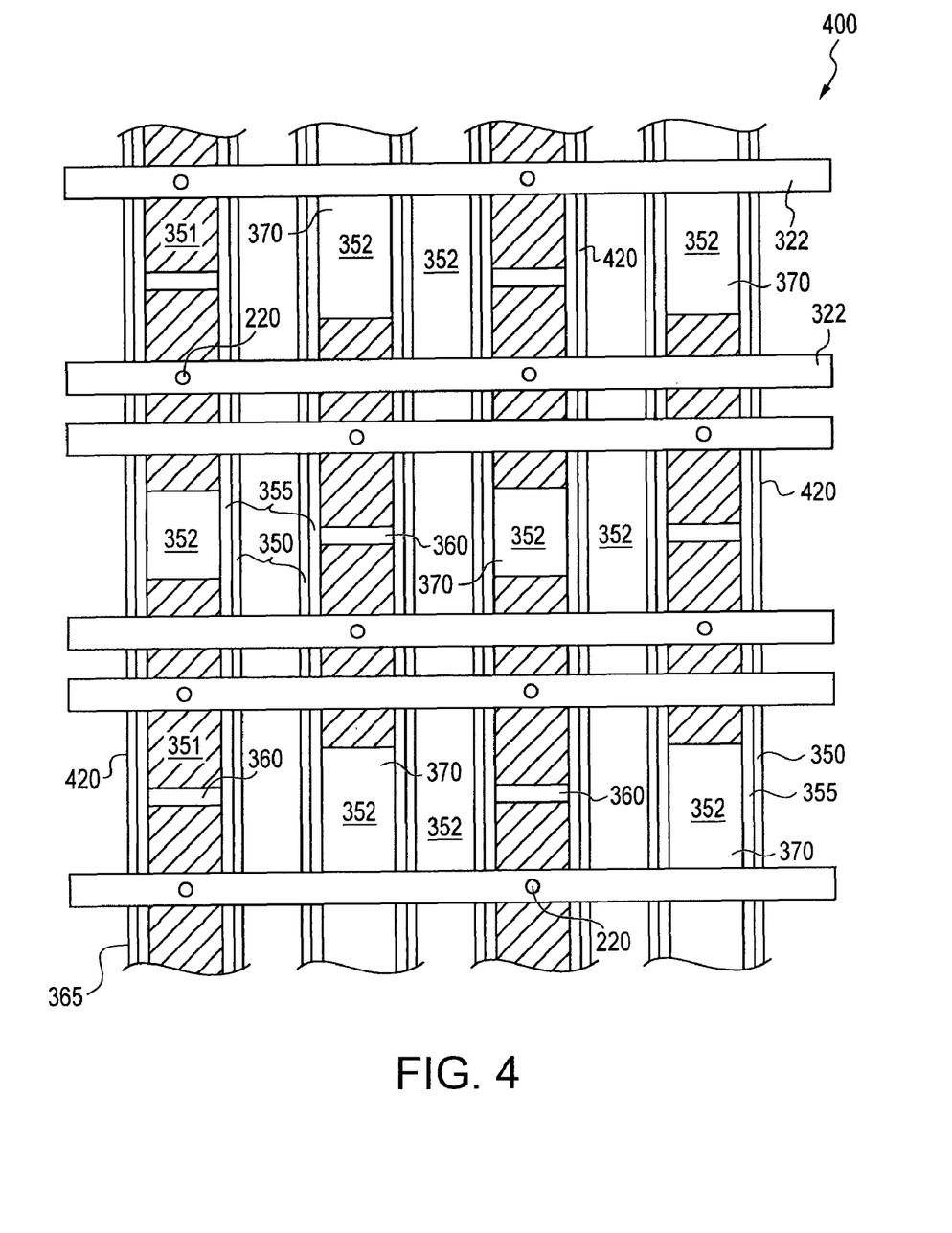
FIG. 4 illustrates an array of memory cells and memory access devices, according to one or more embodiments of the disclosure.

An additional embodiment of a memory array 400 is illustrated in the top view of FIG. 4. The access devices 200 in array 400 are formed on mesas 320 as in array 300. However, in array 400 the mesas 320 have been divided so that gaps 320 exist in the mesas 320 and a single mesa 320 no longer linearly extends as a continuous mesa 320. Instead, many mesas 420 of shorter length extend in a line across the substrate 555. Gaps 370 exist between the shortened mesas 420 within a line 365. Multiple lines of mesas 420 are spaced apart from each other and are arranged in parallel with each other. The shortened mesas 420 illustrated in FIG. 4 include two memory cells 220 per mesa (with a recess 360) located in the drain metal silicide layer 352 between the memory cells 220. Shortened mesas 420 of different lengths could also be used. For example, three or four memory cells 220 per mesa 420 could be used.

Although gaps 370 exist between the shortened mesas 420 in a line 365, the sidewall gates 350 along one or more sides of the mesas 420 in a line still extend continuously for the length of the line 365, bridging the gaps 370. Thus, all mesas 420 in a line 365 still share at least one common gate 350.

The source metal silicide layer 352 in array 400 covers all exposed surfaces of the substrate 555. This means that the source metal silicide layer 352 covers the substrate 555 surface in strips between lines 365 of mesas 420 as well as in the gaps 370 between mesas 420 in a line 365, effectively surrounding the bases of each mesa 420. Additionally, the mesas 420 in adjacent lines 365 may be shifted so that gaps 370 between mesas 420 do not occur in the same linear place for each adjacent line 365 in the array 400. For example, in the illustration of FIG. 4, mesas 420 are arranged in a checkerboard-like pattern. Other arrangements are possible depending on the length of the mesas 420 (i.e., the number of memory cells 220 coupled to each mesa 420). Aligned or un-shifted mesas 420 may also be used.

By using a common source and by surrounding the base of each mesa 420 with the source metal silicide layer 352, the parasitic resistance in the source is reduced. The source metal silicide layer 352 provides additional current paths, resulting in higher current flow. In this example, because every mesa 420 shares a common source, a dedicated contact is not required for any specific strip of source metal silicide layer 352. Thus, efficiency of current flow through the source metal silicide layer 352 to a specific mesa 420 may be improved. Additionally, by using a drain metal silicide layer 351 on the top surface of each mesa 420, the contact resistance between the access device 200 and the bottom electrode 224 of each memory cell 220 is reduced.

As with other embodiments described herein, the silicon mesas 420 of array 400 are not limited to being formed of silicon. Other materials such as Ge, SiC, GaN, GaAs, InP, graphene or carbon nanotubules, for example, may also be used to make the vertical FET devices as well as the underlying substrate. In addition, although double-gated vertical FETs are illustrated, single-gated or surround-gated vertical FETs may also be used, thus providing additional space for a single thicker gate electrode that minimizes resistance. In a double-gated vertical FET arrangement, all gates on a mesa, including gates on different sides of a mesa, may be all interconnected, or may be electrically separate. Gates may be interconnected either at the edge of a memory array or within the array. Additionally, source metal silicide layer 352 may completely cover the substrate near each mesa, or may be arranged in more narrow strips near each mesa. The narrow strips of source metal silicide layer 352 may be electrically interconnected in order to create multiple current paths to an individual mesa, or may be electrically insulated from each other, thus ensuring that a specific narrow strip of source metal silicide layer 352 is used to provide current to a corresponding specific mesa.

The memory access devices of arrays 300, 400 are able to provide large amounts of current through any selected memory cell 220. In both arrays 300, 400, access devices share common sources 130 because of the source metal silicide layers 352. In array 400, every mesa 420 in the array shares a common source 130. In array 300, each mesa 320 uses a respective source 130 for every memory cell 220 coupled to the mesa 320. Thus, the source metal silicide layers 352 help to facilitate a larger source current. Additionally, the mesas 320 and the mesas 420 in each line of mesas 420 share common gates 350 and drains 140. As a result, the multiple current channels 125 available in each line of mesas 320, 420 also increases the amount of current available to be passed through a memory cell 220.

Figure 5:
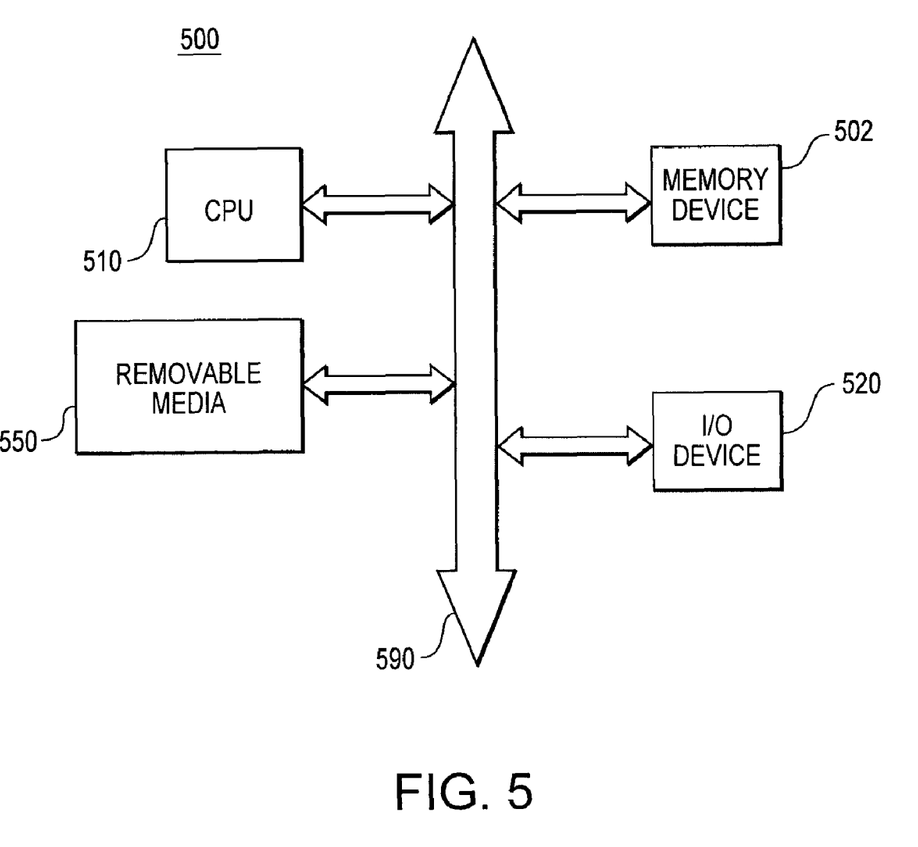
FIG. 5 illustrates a processing system utilizing a memory array, according to one or more embodiments of the disclosure.

It should be appreciated that the arrays 300, 400 may be fabricated as part of an integrated circuit. The corresponding integrated circuits may be utilized in a processor system. For example, FIG. 5 illustrates a simplified processor system 500 which includes a memory device 502 that includes either array 300 or 400 in accordance with any of the above described embodiments. A processor system, such as a computer system, generally comprises a central processing unit (CPU) 510, such as a microprocessor, a digital signal processor, or other programmable digital logic devices, which communicates with an input/output (I/O) device 520 over a bus 590. The memory device 502 communicates with the CPU 510 over bus 590 typically through a memory controller.

In the case of a computer system, the processor system 500 may include peripheral devices such as removable media devices 550 (e.g., CD-ROM drive or DVD drive) which communicate with CPU 510 over the bus 590. Memory device 502 can be constructed as an integrated circuit, which includes one or more phase change memory devices. If desired, the memory device 502 may be combined with the processor, for example CPU 510, as a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A transistor structure comprising:
   a semiconductor material base;
   a semiconductor material mesa upstanding from said base;
   a plurality of electrically isolated first silicide material elements on a top surface of said mesa;
   a second silicide material element supported on said semiconductor material base at least at a first side of said mesa for supplying an electrical connection to said mesa;
   first and second regions respectively coupled to the first and second silicide material elements, the first and second regions being doped to a first conduction type and one or more channel regions between the first and second regions being doped to a second conduction type;
   a first mesa sidewall gate structure provided on said first side of said mesa and comprising a gate insulator material and an overlying gate conductor, said first mesa sidewall gate structure being operative to control current flow through said channel regions between said second silicide material element and each of said first silicide material elements through said mesa; and a plurality of operative electrical devices respectively connected to each of said first silicide elements.

2. A transistor structure as in claim 1 further comprising:
a third silicide material element supported on said semiconductor material base at a second side of said mesa opposite said first side; and
a second mesa sidewall gate structure provided on said second side of said mesa and comprising a gate insulator material and an overlying gate conductor, said second mesa sidewall gate structure being operative to control with said first mesa sidewall gate structure current flow between each of said first silicide material elements and said second material element and each of said first silicide material elements and said third silicide material element through said mesa.

3. A transistor structure comprising:
a semiconductor material base;
a semiconductor material mesa upstanding from said base;
a plurality of electrically isolated first silicide material elements on a top surface of said mesa;
a second silicide material element supported on said semiconductor material base at least at a first side of said mesa for supplying an electrical connection to said mesa;
first and second regions respectively coupled to the first and second silicide material elements, the first and second regions being doped to a first conduction type and one or more channel regions between the first and second regions being doped to a second conduction type;
a first mesa sidewall gate structure provided on said first side of said mesa and comprising a gate insulator material and an overlying gate conductor, said first mesa sidewall gate structure being operative to control current flow through said channel regions between said second silicide material element and each of said first silicide material elements through said mesa;
a third silicide material element supported on said semiconductor material base at a second side of said mesa opposite said first side; and
a second mesa sidewall gate structure provided on said second side of said mesa and comprising a gate insulator material and an overlying gate conductor, said second mesa sidewall gate structure being operative to control with said first mesa sidewall gate structure current flow between each of said first silicide material elements and said second material element and each of said first silicide material elements and said third silicide material element through said mesa; and
a recess in the top surface of each mesa between an adjacent pair of first silicide material elements.

4. A transistor structure comprising:
a semiconductor material base;
a semiconductor material mesa upstanding from said base;
a plurality of electrically isolated first silicide material elements on a top surface of said mesa;
a second silicide material element supported on said semiconductor material base at least at a first side of said mesa for supplying an electrical connection to said mesa;
first and second regions respectively coupled to the first and second silicide material elements, the first and second regions being doped to a first conduction type and one or more channel regions between the first and second regions being doped to a second conduction type;
a first mesa sidewall gate structure provided on said first side of said mesa and comprising a gate insulator material and an overlying gate conductor, said first mesa sidewall gate structure being operative to control current flow through said channel regions between said second silicide material element and each of said first silicide material elements through said mesa;
a plurality of parallel upstanding mesas, wherein each of said upstanding mesas comprises a plurality of first silicide elements spaced along a top mesa surface;
a plurality of second silicide elements supported on said semiconductor material base and extending along at least a first side of a respective mesa; and
a plurality of first mesa sidewall gate structures respectively provided on a first side of a mesa and comprising a gate insulator material and an overlying gate conductor, each first mesa sidewall gate structure being operative to control current flow between a respective second silicide element and a plurality of spaced first silicide elements associated with a respective mesa.

5. A transistor structure as in claim 4, further comprising a plurality of operative electrical devices respectively connected to each of said first silicide elements.

6. A transistor structure comprising:
a semiconductor material base;
a semiconductor material mesa upstanding from said base;
a plurality of electrically isolated first silicide material elements on a top surface of said mesa;
a second silicide material element supported on said semiconductor material base at least at a first side of said mesa for supplying an electrical connection to said mesa;
first and second regions respectively coupled to the first and second silicide material elements, the first and second regions being doped to a first conduction type and one or more channel regions between the first and second regions being doped to a second conduction type;
a first mesa sidewall gate structure provided on said first side of said mesa and comprising a gate insulator material and an overlying gate conductor, said first mesa sidewall gate structure being operative to control current flow through said channel regions between said second silicide material element and each of said first silicide material elements through said mesa;
a plurality of mesas comprising a first linearly aligned group of mesas and a second linearly aligned group of mesas, each of said first and second linearly aligned group of mesas comprising at least a first and second mesa within the group;
a plurality of first silicide elements spaced along a top surface of each mesa, a plurality of second silicide elements supported on said semiconductor material base and extending along at least a first side of said at least first and second mesa of a group; and
a first mesa sidewall gate structure providing on said first side of each said at least first and second mesa of a group and comprising a gate insulator material and an overlying gate conductor, each said first mesa sidewall gate structure being operative to control current flow between a second silicide element common to a group of mesas and a plurality of spaced first silicide elements on the mesas of a group.

7. A memory structure comprising:
a plurality of vertical transistors, each transistor comprising:
a semiconductor material projection extending from a semiconductor material base;
a plurality of first conductors provided on an upper surface of said projection, the first conductors being formed of silicide;

a second conductor provided on said base and adjacent to at least a first sidewall of said projection, the second conductor being formed of silicide; and a first gate structure provided on said first sidewall of said projection for gating current flow between said first and second conductors, at least two of said vertical transistors being provided on each said projection;

a plurality of memory cells each having a first side connected to a respective first conductor of said at least two vertical transistors; and a plurality of third conductors respectively connected to a second side of said plurality of memory cells.

8. A memory structure as in claim 7, further comprising:

a plurality of linearly extending semiconductor material projections, each containing a plurality of said vertical transistors;

a plurality of said first conductors spaced along a top surface of each projection, each being associated with a respective vertical transistor;

a first plurality of said second conductors each extending along at least a first sidewall of a respective semiconductor material projection;

a gate structure extending along said first sidewall of each projection for commonly gating the first and second conductors associated with each projection;

a respective memory cell connected to each of said first conductors; and wherein said plurality of third conductors each respectively connect to a second side of a plurality of memory cells connected to vertical transistors in different semiconductor material projections.

9. A memory structure as in claim 8, wherein said plurality of linearly extending semiconductor material projections are arranged in a plurality of parallel linearly extending lines where each line is formed of a continuous semiconductor material projection.

10. A memory structure as in claim 8, wherein said plurality of linearly extending semiconductor material projections are arranged in parallel spaced lines of projections where a plurality of spaced semiconductor material projections are provided in each said line.

11. A memory structure as in claim 7, further comprising a plurality of fourth conductors provided on said semiconductor base adjacent to at least a second sidewall of a respective projection, and a second gate structure provided on said second sidewall of said respective projection for gating current flow between said first and fourth conductors.

12. A memory structure as in claim 11, wherein said first and second gate structures are interconnected to function as a single gate structure.

13. A memory structure as in claim 10, wherein said second conductor extends over said semiconductor base material in areas between projections provided in a line of spaced projections.

14. A memory structure as in claim 13, wherein said plurality of spaced projections in each line are organized so that spaces between projections on adjacent lines are shifted in relation to one another.

15. A memory structure as in claim 11, wherein said second and fourth conductors are electrically interconnected.

16. A memory structure as in claim 11, wherein second and fourth conductors provided on opposite sides of a respective projection are electrically interconnected.

17. A memory structure as in claim 16, wherein said second and fourth conductors are interconnected in areas between projections provided in a line of spaced projections.

18. An integrated circuit structure comprising:

a semiconductor substrate containing a plurality of trenches therein defining a plurality of upstanding semiconductor mesas arranged in a pattern of a plurality of linearly extending parallel lines of mesas;

a plurality of spaced first silicide material areas on an upper surface of each of said mesas;

a second silicide material on said substrate adjacent to at least a first sidewall of each of said mesas; and a plurality of gate structures respectively provided at least on said first sidewalls of said mesas arranged in each said line of mesas, such that each of said mesas in a line share a common gate structure at said first sidewall.

19. An integrated circuit structure as in claim 18, wherein the second silicide material on said substrate is an electrically continuous silicide structure.

20. An integrated circuit structure as in claim 18, wherein said second silicide material on said substrate is also adjacent a second sidewall of said mesa structures, and wherein said plurality of gate structures are provided on said second sidewalls of said mesas and arranged in each said line such that each of said mesas in a line share a common gate structure at said second sidewall.

21. An integrated circuit structure as in claim 18, wherein each extending mesa line comprises a continuous mesa structure.

22. An integrated circuit structure as in claim 18, wherein each extending mesa line comprises a plurality of spaced mesas.

23. An integrated circuit structure as in claim 22, wherein said second silicide material is further provided on said semiconductor substrate in areas between said plurality of spaced mesas.

24. An integrated circuit structure as in claim 20, wherein each extending mesa line comprises a continuous mesa structure.

25. An integrated circuit structure as in claim 20, wherein each extending mesa line comprises a plurality of spaced mesas.

26. An integrated circuit structure as in claim 25, wherein said second silicide material is further provided on said semiconductor substrate in areas between said plurality of spaced mesas.

* * * * *